(12) United States Patent
Kim

(10) Patent No.: US 10,122,373 B2
(45) Date of Patent: Nov. 6, 2018

(54) ANALOG TO DIGITAL CONVERTER

(71) Applicant: LSIS CO., LTD., Anyang-si, Gyeonggi-do (KR)

(72) Inventor: Jung-Wook Kim, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 15/865,991

(22) Filed: Jan. 9, 2018

(65) Prior Publication Data

US 2018/0287623 A1    Oct. 4, 2018

(30) Foreign Application Priority Data

Apr. 3, 2017  (KR) ........................ 10-2017-0043269

(51) Int. Cl.
  *H03M 1/66*    (2006.01)
  *H03M 1/06*    (2006.01)
  *H03M 1/18*    (2006.01)

(52) U.S. Cl.
  CPC .......... *H03M 1/066* (2013.01); *H03M 1/0604* (2013.01); *H03M 1/18* (2013.01)

(58) Field of Classification Search
  CPC ...... H03M 1/066; H03M 1/0604; H03M 1/18; H03M 1/06; H03M 1/12; H03M 1/164
  USPC .................................................. 341/126, 155
  See application file for complete search history.

(56) References Cited

U.S. PATENT DOCUMENTS

| | | | | |
|---|---|---|---|---|
| 5,404,375 A | * | 4/1995 | Kroeger | H04B 7/216 375/132 |
| 5,640,202 A | * | 6/1997 | Kondo | H04N 5/232 348/222.1 |
| 5,799,111 A | * | 8/1998 | Guissin | H04N 19/86 358/447 |
| 6,060,984 A | * | 5/2000 | Braun | B60C 23/06 340/442 |

(Continued)

FOREIGN PATENT DOCUMENTS

| | | |
|---|---|---|
| JP | 2014236252 A | 12/2014 |
| JP | 2016082509 A | 5/2016 |

(Continued)

OTHER PUBLICATIONS

Korean Office Action for related Korean Application No. 10-2017-0043269; action dated Jan. 19, 2018; (4 pages).

(Continued)

*Primary Examiner* — Jean B Jeanglaude
(74) *Attorney, Agent, or Firm* — K&L Gates LLP

(57) ABSTRACT

An A/D converter includes: an input unit configured to receive an analog input signal, a preprocessing unit configured to convert the input signal into a digital preprocessing signal based on a dynamic range of the input signal and a first resolution corresponding to a predetermined first bit number, a first conversion unit configured to convert the preprocessing signal into a first output signal based on a second resolution corresponding to a second bit number smaller than the first bit number, and a second conversion unit configured to convert the preprocessing signal into a second output signal based on a third resolution corresponding to a third bit number which is smaller than the first bit number and is different from the second bit number.

5 Claims, 3 Drawing Sheets

(56) References Cited

U.S. PATENT DOCUMENTS

| | | | |
|---|---|---|---|
| 6,633,406 B1* | 10/2003 | Imaizumi | H04N 1/00681 |
| | | | 358/1.12 |
| 6,720,999 B1 | 4/2004 | Holberg et al. | |
| 6,791,484 B1 | 9/2004 | Lee et al. | |
| 7,053,946 B2* | 5/2006 | Takahashi | H04N 5/235 |
| | | | 348/294 |
| 7,154,495 B1 | 12/2006 | Bucklen | |
| 7,446,684 B2 | 11/2008 | Huang | |
| 8,891,673 B1* | 11/2014 | Sternowski | H04L 27/2647 |
| | | | 375/296 |
| 2003/0078007 A1 | 4/2003 | Parssinen et al. | |
| 2007/0021394 A1 | 9/2007 | Schmuel et al. | |
| 2010/0246547 A1* | 9/2010 | Yoon | H01Q 3/24 |
| | | | 370/338 |
| 2011/0285569 A1 | 11/2011 | Steensgaard-Madsen | |
| 2014/0232577 A1* | 8/2014 | Noguchi | H03M 1/005 |
| | | | 341/118 |

FOREIGN PATENT DOCUMENTS

| | | | |
|---|---|---|---|
| JP | 2016205897 A | 12/2016 | |
| KR | 101413035 B1 | 7/2014 | |
| KR | 20150133290 A | 11/2015 | |
| KR | 101651140 B1 | 8/2016 | |

OTHER PUBLICATIONS

European Office Action for related European Application No. 18150442.4; action dated Jul. 27, 2018; (8 pages).

* cited by examiner

ANALOG TO DIGITAL CONVERTER

CROSS-REFERENCE TO RELATED APPLICATIONS

Pursuant to 35 U.S.C. § 119(a), this application claims the benefit of earlier filing date and right of priority to Korean Patent Application No. 10-2017-0043269 filed on Apr. 3, 2017, in the Korean Intellectual Property Office, the disclosure of which is hereby incorporated by reference in its entirety.

BACKGROUND

1. Technical Field

The present disclosure relates to an analog to digital (AD) converter for converting an analog signal into a digital signal, and more particularly to an AD converter that may be included in an analog input module of a programmable logic controller (PLC).

2. Description of the Related Art

Recently, in realizing the automation equipment, relays for sequentially connecting control target devices performing their respective processes according to the order of processes have been replaced by PLCs (Programmable Logic Controllers).

A PLC system is a system for driving and controlling the control target devices according to the order of processes, which is advantageous in that the order of processes can be easily changed, added and deleted.

Specifically, the PLC system performs program control using a basic sequence control function and a numerical computing function and executes a program stored in an internal memory to perform predetermined logic. Such a PLC system is being applied to various tasks such as device control, device numerical setting, time control, real-time monitoring, real-time data collection, and safety device operation, etc.

Generally, a PLC system includes at least one computing module and a plurality of extension modules connected thereto. Each of the plurality of extension modules includes an analog input module for processing analog signals of the control target devices.

Since the computing module performs computation using a digital signal, the analog input module generally includes an AD converter for converting an analog signal into a digital signal.

This AD converter can be applied to a wide variety of signal conversions as it provides various resolutions. That is, the greater the number of resolutions, the better the compatibility of the AD converter.

To this end, the conventional AD converter includes a plurality of conversion units corresponding to a plurality of resolutions. Here, each conversion unit converts an analog signal into a digital signal according to each resolution.

That is, among the plurality of conversion units, a conversion unit that outputs a 14-bit digital signal converts an analog signal into a 14-bit digital signal according to the resolution of dividing a dynamic range (or full scale range (FSR)) of the analog signal into $2^{14}$ levels.

In addition, among the plurality of conversion units, a conversion unit that outputs a 16-bit digital signal converts an analog signal into a 16-bit digital signal according to the resolution of dividing a dynamic range (or FSR) of the analog signal into $2^{16}$ levels.

However, when the conventional AD converter provides various resolutions for improving efficiency and compatibility, there is a problem that the device size and simplification are limited due to the inclusion of a conversion unit for each resolution.

Further, when the AD converter outputs two or more digital signals corresponding to two or more resolutions, two or more conversion units corresponding to the two or more resolutions have to be driven. Therefore, as the resolution of the AD converter increases, there is a problem that the delay time and power consumption required for driving the AD converter may rapidly increase.

SUMMARY

It is an aspect of the present disclosure to provide an AD converter capable of preventing the increase in delay time and power consumption, while coping with a plurality of resolutions.

The above and/or other aspects and advantages of the present disclosure will become apparent and more readily appreciated from the following description of the embodiments, taken in conjunction with the accompanying drawings. It should be understood that the objects and advantages of the present disclosure can be realized by features and combinations thereof set forth in the claims.

In accordance with one aspect of the present disclosure, there is provided an A/D converter for converting an analog signal into a digital signal, including: an input unit configured to receive an analog input signal; a preprocessing unit configured to convert the input signal into a digital preprocessing signal based on a dynamic range of the input signal and a first resolution corresponding to a predetermined first bit number; a first conversion unit configured to convert the preprocessing signal into a first output signal based on a second resolution corresponding to a second bit number smaller than the first bit number; and a second conversion unit configured to convert the preprocessing signal into a second output signal based on a third resolution corresponding to a third bit number which is smaller than the first bit number and is different from the second bit number.

when the first bit number is N (N being a natural number equal to or greater than 2), the preprocessing signal corresponding to the minimum value in the dynamic range of the input signal may be 0 and the preprocessing signal corresponding to the maximum value in the dynamic range of the input signal may be more than 1 and equal to or less than $2^N$.

When the first bit number is N, the second bit number is i, and the third bit number is j, the first conversion unit may convert the preprocessing signal into the first output signal by dividing the preprocessing signal by $2^{(N-i)}$ and the second conversion unit may convert the preprocessing signal into the second output signal by dividing the preprocessing signal by $2^{(N-j)}$.

According to the present disclosure, the AD converter converts the input signal into the preprocessing signal having the first bit number and then converts the preprocessing signal into the first output signal having the second bit number smaller than the first bit number or into the second output signal having the third bit number smaller than the first bit number. That is, the AD converter does not convert the input signal into the first output signal having the second bit number or the second output signal having the third bit number. Instead, the AD converter converts the preprocessing signal having the first bit number into the first output signal or the second output signal through an operation of reducing the number of bits. Here, the operation of reducing the number of bits can be performed relatively simply through a bit shift operation.

Accordingly, each conversion unit for converting the preprocessing signal into the first or second output signal can be implemented with a relatively simple circuit, which is advantageous for device miniaturization and simplification.

In addition, since the conversion operation from the preprocessing signal into the first or second output signal is relatively simple, it is possible to prevent a rapid increase in delay time and power consumption required for the conversion operation even when the number of output signals having different resolutions increases.

DETAILED DESCRIPTION

Figure 1:
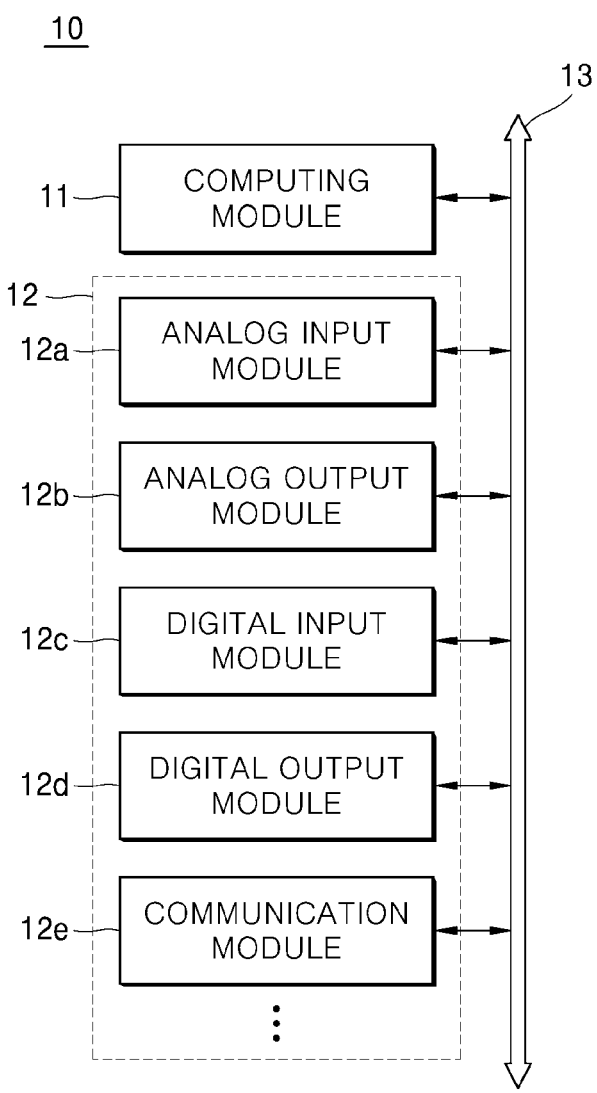
FIG. 1 is a diagram illustrating an example of a PLC device.

The above objects, features and advantages will become more clearly apparent from the following detailed description in conjunction with the accompanying drawings. Therefore, the technical ideas of the present disclosure can be easily understood and practiced by those skilled in the art. In the following detailed description of the present disclosure, concrete description on related functions or constructions will be omitted if it is deemed that the functions and/or constructions may unnecessarily obscure the gist of the present disclosure. Hereinafter, preferred embodiments of the present disclosure will be described in detail with reference to the accompanying drawings. Throughout the drawings, the same or similar elements are denoted by the same reference numerals.

Hereinafter, an AD converter according to an embodiment of the present disclosure will be described in detail with reference to the accompanying drawings.

First, an analog input module including an AD converter according to an embodiment of the present disclosure and a PLC device including the analog input module will be described with reference to FIG. 1.

FIG. 1 is a diagram illustrating an example of a PLC device.

As illustrated in FIG. 1, a PLC device 10 includes a computing module 11 for executing each program, at least one extension module 12 connected to the computing module 11, and a bus module 13 for data communication between the computing module 11 and the extension module 12.

The at least one extension module 12 includes an analog input module 12a to which an analog signal of a control target device (not shown) is input, an analog output module 12b that outputs an analog signal to the control target device, a digital input module 12c to which a digital signal of the control target device is input, a digital output module 12d that outputs a digital signal to the control target device, a communication module 12e that provides data communication using an external network, etc.

In addition, although not shown in FIG. 1, the extension module 12 of the PLC device 10 may include a monitoring module (not shown) for monitoring data according to execution of a program, and a peripheral circuit unit (not shown) for controlling data backup or reset.

At least the analog input module 12a of the extension module 12 includes an AD converter for converting an analog signal into a digital signal.

However, this is merely an example, and the AD converter according to the embodiment of the present disclosure can be applied to any devices including a function of converting an analog signal into a digital signal in addition to the PLC device 10.

The AD converter according to the embodiment of the present disclosure provides two or more different resolutions in order to improve the utility and compatibility. That is, the AD converter may convert an analog signal into a plurality of digital signals having different numbers of bits based on at least one of two or more different resolutions, which is selected according to the intention of a designer.

Next, the AD converter according to the embodiment of the present disclosure will be described in detail.

Figure 2:
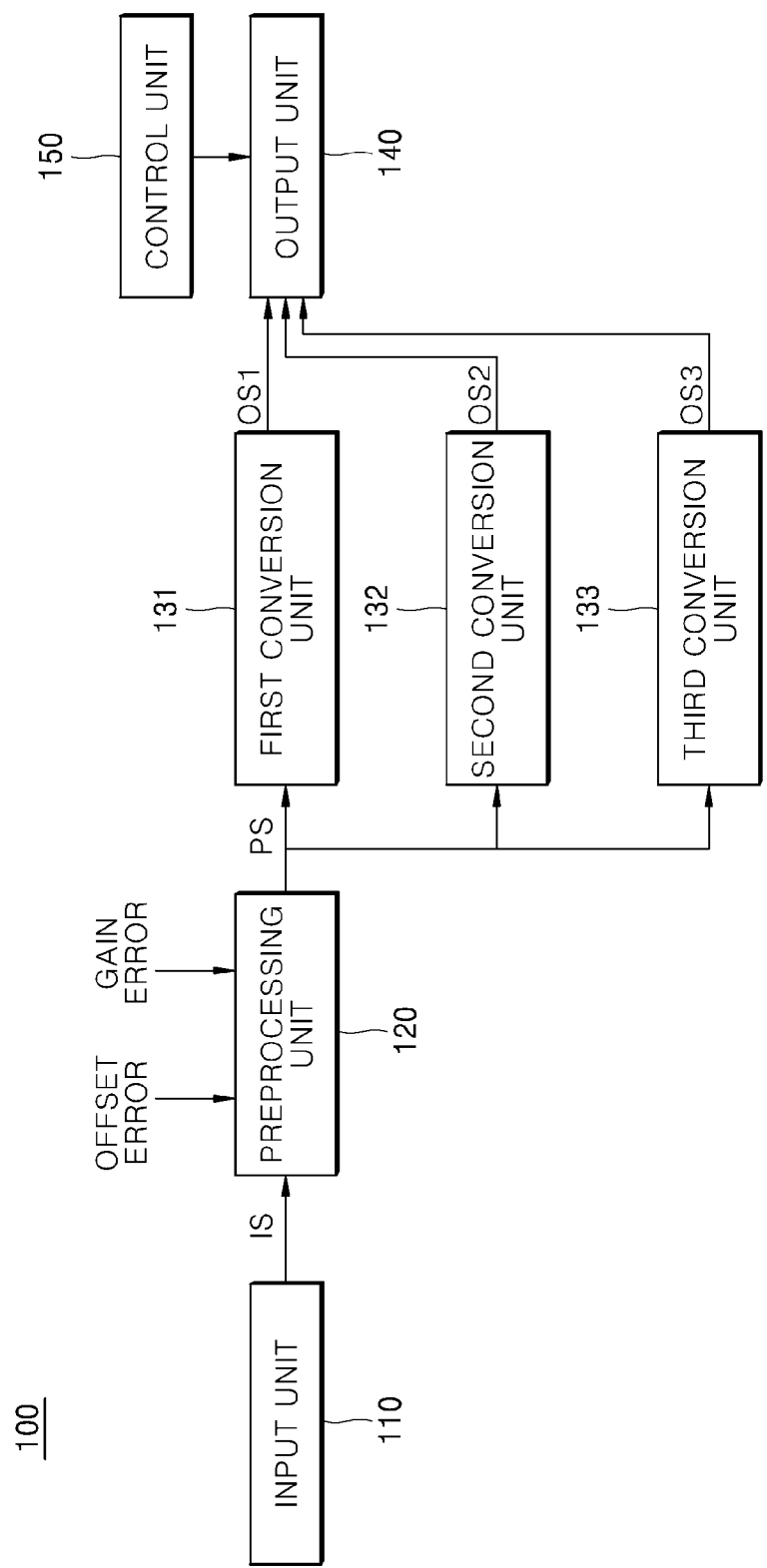
FIG. 2 is a diagram illustrating an AD converter according to an embodiment of the present disclosure.
Figure 3:
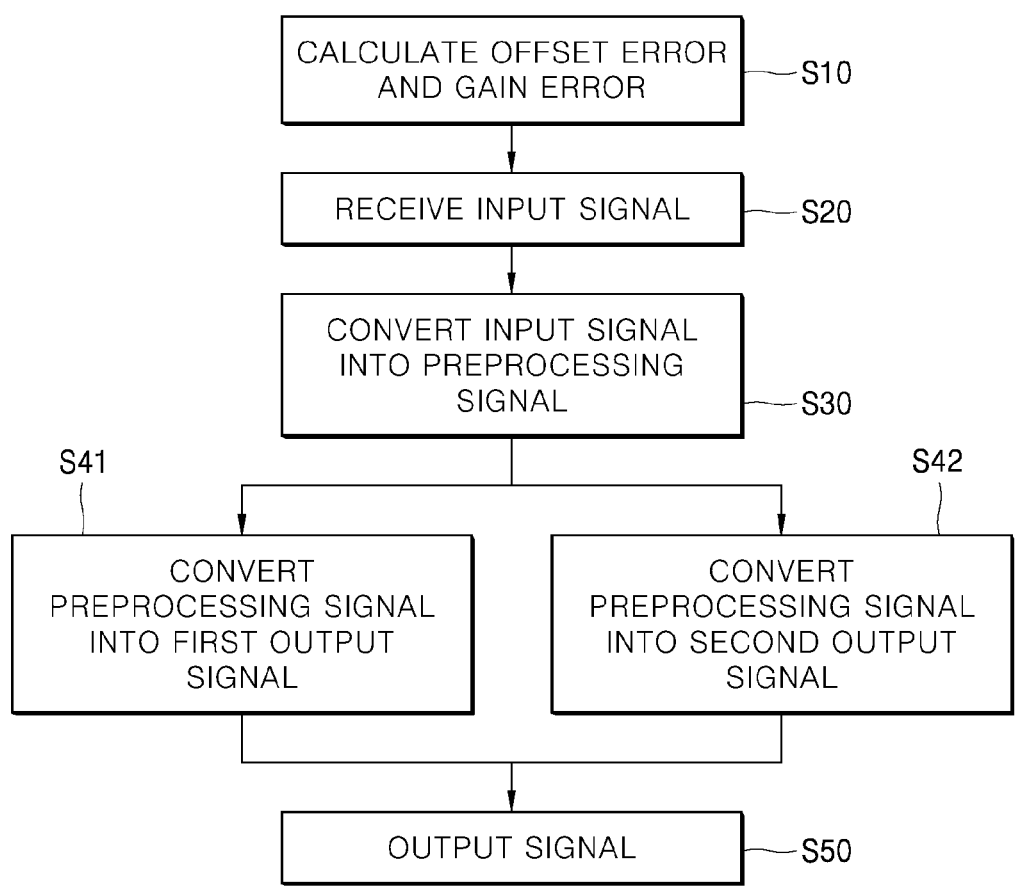
FIG. 3 is a diagram illustrating a process of converting an analog signal into a digital signal having various resolutions, which is performed by the AD converter according to the embodiment of the present disclosure.

FIG. 2 is a diagram illustrating the AD converter according to the embodiment of the present disclosure. FIG. 3 is a diagram illustrating a process of converting an analog signal into a digital signal having various resolutions, which is performed by the AD converter according to the embodiment of the present disclosure.

As illustrated in FIG. 2, the AD converter 100 according to the embodiment of the present disclosure includes an input unit 110 for receiving an analog input signal IS, a preprocessing unit 120 for converting the input signal IS into a digital preprocessing signal PS, a first conversion unit 131 for converting the preprocessing signal PS into a first output signal OS1, a second conversion unit 132 for converting the preprocessing signal PS into a second output signal OS2, a third conversion unit 133 for converting the preprocessing signal PS into a third output signal OS3, an output unit 140 for outputting at least one of the first, second and third output signals OS1, OS2 and OS3, and a control unit 150 for controlling at least the output unit 140.

The input unit 110 receives the analog input signal IS from the outside. At this time, the input unit 110 can sense the input signal IS received through the input terminal of the analog input module (12a in FIG. 1) incorporating the AD converter 100.

Although not shown in detail in FIG. 2, the input unit 110 may include an amplifier for amplifying the input signal IS and a filter for removing a noise of the input signal IS.

The preprocessing unit 120 converts the input signal into the digital preprocessing signal PS based on a dynamic range of the input signal IS and a first resolution corresponding to a first bit number.

At this time, the preprocessing unit 120 generates the preprocessing signal PS reflecting an offset error and a gain error inherent to the AD converter 100.

Specifically, based on an extended range for error detection in which a margin is added to both ends of the dynamic range of the input signal IS, and a resolution for error detection corresponding to a bit number for error detection larger than the first bit number, the preprocessing unit 120 converts the input signal IS into a first digital value. The preprocessing unit 120 corrects the offset error and the gain error calculated according to the error detection resolution and converts the first digital value into a second digital value. Then, the preprocessing unit 120 converts the second digital value into the preprocessing signal PS based on a deviation between the error detection resolution and the first resolution.

Illustratively, the offset error and the gain error can be obtained as follows.

First, an error detection extended range and an error detection bit number are selected.

As one example, when the dynamic range of the input signal IS is 0V to 10V and the first bit number is 19, the first resolution of the preprocessing unit 120 is calculated as $10V/2^{19}$. In this case, the error detection extended range may be selected as −2.5V to 12.5V in the form of adding a margin of 2.5V to t both ends of the dynamic range, and error detection bit number may be selected as 24 higher than the first bit number. At this time, the detection error resolution is calculated as $15V/2^{24}$.

The offset error may be calculated as a deviation between a measured value and an ideal value of first digital data corresponding to the lowest value (0V in this example) in the dynamic range of the input signal IS.

Here, the ideal value of the first digital data corresponding to the lowest value (0V in this example) in the dynamic range of the input signal IS is detected based on the error detection resolution. Then, the measured value of the first digital data is detected by converting the input signal having the actual lowest value according to the error detection resolution. Subsequently, the offset error can be calculated by detecting the deviation between the measured value and the ideal value of the first digital data.

The gain error can be calculated as a deviation between a measured value and an ideal value of each of slopes of the first and second digital data corresponding respectively to the lowest and highest values in the dynamic range of the input signal IS.

That is, the ideal value of the first digital data corresponding to the lowest value (0V in this example) in the dynamic range of the input signal IS and the ideal value of the second digital data corresponding to the highest value (10V in this example) in the dynamic range of the input signal IS are detected based on the error detection resolution. Then, the measured values of the first and second digital data are detected by converting the input signal IS having the actual lowest value and the input signal IS having the actual highest value according to the error detection resolution. Subsequently, the gain error can be calculated by detecting a deviation between the slope of the measured value of each of the first and second digital data and the slope of the ideal value of each of the first and second digital data.

The preprocessing unit 120 first converts the input signal IS into the first digital value according to the error detection resolution in order to reflect the offset error and the gain error in the preprocessing signal PS. Then, the second digital value is generated by correcting the offset error and the gain error to the first digital value. Further, based on the deviation between the error detection resolution (24 in this example) and the first resolution (19 in this example), the second digital value is converted into the preprocessing signal PS with the first resolution.

The preprocessing unit 120 may perform conversion operations corresponding respectively to a process of generating the first digital value, a process of generating the second digital value, and a process of generating the preprocessing signal PS.

Alternatively, if the error detection resolution, the offset error, the gain error and the first resolution are already set, the preprocessing unit 120 may perform a conversion operation corresponding to a process of converting the input signal IS into the preprocessing signal PS based on the error detection resolution, the offset error, the gain error and the first resolution.

Thus, the preprocessing unit 120 converts the input signal IS to generate the preprocessing signal PS with the first bit number.

At this time, when the first bit number is N (N is a natural number equal to or greater than 2), the preprocessing signal PS corresponding to the minimum value (0V in this example) in the dynamic range of the input signal IS is 0 ($=2^0-1$), and the preprocessing signal PS corresponding to the maximum value (10V in this example) in the dynamic range of the input signal IS is more than 1 and equal to or less than $2^N$.

As one example, when the first bit number is 19, the preprocessing signal PS corresponding to the minimum value in the dynamic range of the input signal IS may be set to 0, and the preprocessing signal PS corresponding to the maximum value in the dynamic range of the input signal IS may be set to any value in a range of 1 to $2^{19}$. At this time, for user's convenience, the preprocessing signal PS corresponding to the maximum value in the dynamic range of the input signal IS may be set as a decimal number (for example, 512,000) which is adjacent to the maximum value in the range of 1 to $2^{19}$ and can be easily recognized by a user.

The first conversion unit 131 converts the preprocessing signal PS having the first bit number to generate the first output signal OS1 having a second bit number smaller than the first bit number.

Here, the first conversion unit 131 converts the preprocessing signal PS into the first output signal OS1 based on a deviation between the first bit number and the second bit number. As one example, when the first bit number is N (N is a natural number equal to or greater than 2) and the second bit number is i (i is a natural number equal to or greater than 2 and less than N), the first conversion unit 131 converts the preprocessing signal PS having the first bit number (N) into the first output signal OS1 having the second bit number (i) by dividing the preprocessing signal PS by $2^{(N-i)}$.

That is, the first conversion unit 131 generates the first output signal OS1 by performing an operation of reducing a bit number by the deviation of the first bit number and the second bit number for the preprocessing signal PS.

Here, the operation of reducing a bit number can be performed by a binary division operation, which can be performed relatively simply through a bit shift operation. That is, the binary division operation can be performed by shifting a bit to the right by the bit number deviation.

As a result, the first conversion unit 131 can use an operation of shifting the preprocessing signal PS to the right by (N-i) bits to generate the first output signal OS1. The second conversion unit 132 converts the preprocessing signal PS having the first bit number to generate the second output signal OS2 having a third bit number that is smaller than the first bit number and is different from the second bit number.

Here, the second conversion unit 132 converts the preprocessing signal PS into the second output signal OS2 based on a deviation between the first bit number and the third bit number. As one example, when the first bit number is N (N is a natural number equal to or greater than 2) and the third bit number is j (j is a natural number equal to or greater than 2 and less than N, where i≠j), the second conversion unit 131 converts the preprocessing signal PS having the first bit number (N) into the second output signal OS2 having the third bit number (j) by dividing the preprocessing signal PS by $2^{(N-j)}$.

As described above, since the operation of reducing a bit number can be performed by a binary division operation, the second conversion unit 132 can perform an operation of shifting the preprocessing signal PS to the right by (N-j) bits to generate the second output signal OS2.

The third converter 133 converts the preprocessing signal PS having the first bit number to generate the third output signal OS3 having a fourth bit number which is smaller than the first bit number and is different from the second and third bit numbers. As one example, when the first bit number is N (N is a natural number equal to or greater than 2) and the fourth bit number is k (k is a natural number equal to or greater than 2 and less than N, where i≠j≠k), the third conversion unit 133 converts the preprocessing signal PS having the first bit number (N) into the third output signal OS3 having the fourth bit number (k) by dividing the preprocessing signal PS by $2^{(N-k)}$.

Although only the first, second and third conversion units 131, 132 and 133 are shown in FIG. 2, the AD converter 100 according to the embodiment of the present disclosure may include four or more conversion units corresponding respectively to four or more different resolutions which are smaller than the first resolution of the preprocessing unit 120.

The output unit 140 outputs at least one of the first, second and third output signals OS1, OS2 and OS3 from the first, second and third conversion units 131, 132 and 133.

At this time, the output unit 140 can select at least one of the first, second and third output signals OS1, OS2 and OS3 based on a control signal from the control unit 150.

In addition, the output unit 140 can also output at least one of die first, second and third output signals OS1, OS2 and OS3 to terminals connected to different external devices, based on a control signal from the control unit 150.

The control unit 150 controls the driving of at least the output unit 140. In addition, the control unit 150 can also control the driving of each of the first, second and third conversion units 131, 132 and 133. Thus, it is possible to selectively drive at least some of a plurality of conversion units included in the AD converter 100, corresponding to resolutions selected by a user or according to a design. That is, it is possible to stop the driving of unnecessary some of the plurality of conversion units included in the AD converter 100 so that power consumption and computation of the AD converter 100 can be reduced.

Referring to FIG. 3, a process performed by the AD converter 100 according to the embodiment of the present disclosure to convert the analog signal IS to output the digital signals OS1, OS2 and OS3 includes a step (S10) of calculating an offset error and a gain error, a step (S20) of receiving an analog input signal IS, a step (S30) of converting the input signal IS into a preprocessing signal PS based on the offset error, the gain error and a first resolution, a step (S41) of converting the preprocessing signal PS into a first output signal OS1 based on a second resolution, a step (S42) of converting the preprocessing signal PS into a second output signal OS2 based on a third resolution, and a step (S50) of outputting at least one of the first and second output signals OS1 and OS2.

In the step S10 of calculating the offset error and the gain error, based on an error detection resolution, an ideal value and a measured value of digital data corresponding to the minimum value in a dynamic range of the input signal IS are detected and an ideal value and a measured value of digital data corresponding to the maximum value in the dynamic range of the input signal IS are detected. Then, the offset error is calculated based on a deviation between the ideal value and the measured value of the digital data corresponding to the minimum value in the dynamic range. The gain error is calculated based on a deviation between a slope of the ideal value and a slope of the measured value for the digital data corresponding to the minimum value and the maximum value of the dynamic range.

Upon receiving the analog input signal IS through the input unit 110 (Step S20), the preprocessing unit 120 converts the input signal IS according to the first resolution to generate the preprocessing signal PS having a first bit number (Step S30).

Subsequently, at least one of the plurality of conversion units 131, 132 and 133, which is selected under control of the control unit 150, performs a conversion operation of reducing the number of bits of the preprocessing signal PS to generate an output signal (Steps S41 and S42).

The output unit 140 outputs the output signal from the at least one of the plurality of conversion units 131, 132 and 133 under control of the control unit 150 (Step S50).

In this way, the AD converter 100 according to the embodiment of the present disclosure can convert the analog input signal according to different resolutions, thereby generating a plurality of output signals having different bit numbers, which can result in improvement in compatibility and utility.

As described above, the AD converter 100 includes the preprocessing unit 120 for converting the input signal to generate the preprocessing signal PS having the first bit number, and the plurality of conversion units 131, 132 and 133 for converting the preprocessing signal PS to generate the plurality of output signals OS1, OS2 and OS3 having different bit numbers. At this time, the preprocessing signal PS according to the first resolution is a digital signal corresponding to the input signal IS and having a correction of the offset error and the gain error inherent to the AD converter 100. Accordingly, each of the conversion units 131, 132 and 133 can generate an output signal of each resolution through an operation of reducing the number of bits of the preprocessing signal PS. At this time, the operation of reducing the number of bits can be implemented with a bit shift operation, thereby relatively simply and easily implementing each of the conversion units 131, 132 and 133.

That is, each conversion unit can be implemented with a simpler operation than an operation of converting an input signal into an output signal of each resolution. This can be advantageous for downsizing and simplification of the AD converter 100 and a device (for example, the analog input module 12a) including the AD converter.

In addition, since delay time and power consumption required for the operation of each of the conversion sections 131, 132 and 133 can be reduced, it is possible to prevent a rapid increase in delay time and power consumption by the AD converter 100 even when the number of resolutions of the AD converter 100 increases.

While the present disclosure has been particularly shown and described with reference to exemplary embodiments thereof, it will be understood by those skilled in the art that various changes in form and details may be made therein without departing from the spirit and scope of the present disclosure. The exemplary embodiments are provided for the purpose of illustrating the invention, not in a limitative sense. Thus, it is intended that the present disclosure covers the modifications and variations of this invention provided they come within the scope of the appended claims and their equivalents.

What is claimed is:

1. An A/D converter for converting an analog signal into a digital signal, comprising:
    an input unit configured to receive an analog input signal;
    a preprocessing unit configured to convert the input signal into a digital preprocessing signal based on a dynamic range of the input signal and a first resolution corresponding to a predetermined first bit number;
    a first conversion unit configured to convert the preprocessing signal into a first output signal based on a second resolution corresponding to a second bit number smaller than the first bit number;
    a second conversion unit configured to convert the preprocessing signal into a second output signal based on a third resolution corresponding to a third bit number which is smaller than the first bit number and is different from the second bit number; and
    an output unit configured to output at least one of the first output signal and the second output signal.

2. The A/D converter according to claim 1, wherein, when the first bit number is N, where N is a natural number equal to or greater than 2, the preprocessing signal corresponding to the minimum value in the dynamic range of the input signal is 0 and the preprocessing signal corresponding to the maximum value in the dynamic range of the input signal is more than 1 and equal to or less than $2^N$.

3. The A/D converter according to claim 1, wherein, when the first bit number is N, the second bit number is i, and the third bit number is j, the first conversion unit converts the preprocessing signal into the first output signal by dividing the preprocessing signal by $2^{(N-i)}$ and the second conversion unit converts the preprocessing signal into the second output signal by dividing the preprocessing signal by $2^{(N-j)}$.

4. The A/D converter according to claim 1, wherein the preprocessing unit converts the input signal into a first digital value based on an error detection extended range in which a margin is added to both ends of the dynamic range of the input signal, and an error detection resolution corresponding to an error detection bit number larger than the first bit number, converts the first digital value into a second digital value by correcting an offset error and a gain error calculated according to the error detection resolution, and converts the second digital value into the preprocessing signal based on a deviation between the error detection resolution and the first resolution.

5. The A/D converter according to claim 1, further comprising an output unit configured to output at least one of the first and second output signals.

* * * * *